United States Patent
Shiraishi et al.

(10) Patent No.: US 7,649,267 B2
(45) Date of Patent: Jan. 19, 2010

(54) PACKAGE EQUIPPED WITH SEMICONDUCTOR CHIP AND METHOD FOR PRODUCING SAME

(75) Inventors: Tsukasa Shiraishi, Osaka (JP); Yukihiro Ishimaru, Osaka (JP); Seiji Karashima, Osaka (JP); Seiichi Natkatani, Osaka (JP); Hiroki Yabe, Osaka (JP)

(73) Assignee: Panasonic Corporation, Osaka (JP)

( * ) Notice: Subject to any disclaimer, the term of this patent is extended or adjusted under 35 U.S.C. 154(b) by 194 days.

(21) Appl. No.: 11/884,613

(22) PCT Filed: Mar. 8, 2006

(86) PCT No.: PCT/JP2006/304442

§ 371 (c)(1),
(2), (4) Date: Aug. 17, 2007

(87) PCT Pub. No.: WO2006/098196

PCT Pub. Date: Sep. 21, 2006

(65) Prior Publication Data

US 2008/0265437 A1   Oct. 30, 2008

(30) Foreign Application Priority Data

Mar. 17, 2005   (JP)   ............... 2005-076798

(51) Int. Cl.
*H01L 29/41* (2006.01)
*H01L 21/00* (2006.01)
(52) U.S. Cl. ............... 257/778; 257/E21.503; 257/E23.023
(58) Field of Classification Search ................ 257/778, 257/E23.023, E21.503; 438/108
See application file for complete search history.

(56) References Cited

U.S. PATENT DOCUMENTS

| 6,121,062 | A | * | 9/2000 | Karasawa et al. ............. 438/15 |
| 6,462,427 | B2 | * | 10/2002 | Sakiyama et al. ........... 257/786 |
| 2002/0185309 | A1 | | 12/2002 | Imamura et al. |

FOREIGN PATENT DOCUMENTS

| JP | 1-157796 | 6/1989 |
| JP | 2000-094179 | 4/2000 |
| JP | 2000-332055 | 11/2000 |
| JP | 2002-329745 | 11/2002 |
| JP | 2003-124251 | 4/2003 |
| JP | 2004-247534 | 9/2004 |
| JP | 2004-260131 | 9/2004 |

* cited by examiner

*Primary Examiner*—Evan Pert
(74) *Attorney, Agent, or Firm*—McDermott Will & Emery LLP (57) ABSTRACT

A highly reliable, high-productivity package equipped with a semiconductor chip, and a method for producing the same. In a package (100) comprising a semiconductor chip (10) and a mounting substrate (30), a plurality of electrode terminals (12) are formed on the surface (10*a*) of the semiconductor chip (10) opposing the mounting substrate side, connection terminals (32) respectively corresponding to the plurality of electrode terminals (12), are formed on the mounting substrate (30), the connection terminals (32) on the mounting substrate (30) and the electrode terminals (12) are electrically connected collectively by solder bumps (17) formed in self-assembly, an electrode pattern (20) not connected with the electrode terminals (12) and the connection terminals (32) is formed on the chip surface (10*a*) or the surface (35) of the mounting substrate (30) corresponding to the chip surface (10*a*), and solder (19) is accumulated on the electrode pattern (20).

13 Claims, 9 Drawing Sheets

PACKAGE EQUIPPED WITH SEMICONDUCTOR CHIP AND METHOD FOR PRODUCING SAME

RELATED APPLICATIONS

This application is the U.S. National Phase under 35 U.S.C. § 371 of International Application No. PCT/JP2006/304442, filed on Mar. 8, 2006, which in turn claims the benefit of Japanese Application No. 2005-076798, filed on Mar. 17, 2005, the disclosures of which Applications are incorporated by reference herein.

TECHNICAL FIELD

The present invention relates to packages equipped with semiconductor chips and methods for producing the same. In particular, the present invention relates to high-productivity packages employing flip-chip packaging.

BACKGROUND ART

In recent years, semiconductor integrated circuits (large-scale integrated circuit: LSI) used in electronic equipment have had higher packing density and higher degree of integration. With such trend, LSI chips having higher-pin-count, finer-pitch connection terminals are rapidly developed. For packaging of these LSI chips onto a wiring substrate, flip-chip packaging is widely used in order to reduce wiring delay. Generally, in the flip-chip packaging, a solder bump is formed on a connection terminal in an LSI chip, and the chip is collectively connected through the solder bump to an electrode terminal formed on a wiring substrate.

However, in order to package onto the wiring substrate the next-generation LSI having connection terminals as great as 5000 or more, it is necessary to form bumps adaptable to a fine pitch design less than 100 μm, but a currently used solder bump formation technology is difficult to adapt to such design. Moreover, a great number of bumps according to the number of connection terminals have to be formed therein. Therefore, in order to reduce production costs, high productivity of devices attained by cutting the mounting time per chip is also demanded.

Conventionally, as a bump formation technique, for example, a plating method or a screen printing method has been developed. The plating method is suited for fine-pitch design, but it has a problem with productivity due to its complicated process. On the other hand, the screen printing method excels in productivity, but it is not suited to fine-pitch design due to use of masks.

In light of such current circumstances, some techniques for selectively forming solder bumps on electrodes on an LSI chip or a wiring substrate have been recently developed. These techniques are suited for formation of fine bumps. In addition to this, these techniques can collectively form bumps, so that they also excel in productivity. Therefore, they are attracting attention as a technique adaptable to packaging of a next-generation LSI onto a wiring substrate.

One of these techniques is disclosed in, for example, Patent Document 1. In this technique, solder paste made of a mixture of solder powder and flux is applied entirely over a substrate formed at its surface with an electrode, and the resulting substrate is heated to melt the solder powder, thereby selectively forming a solder bump on the electrode having high wettability.

For example, in a technique disclosed in Patent Document 2, composite paste (chemical deposition type solder) mainly containing lead salt of organic acid and metal tin is applied entirely over a substrate formed with an electrode and the resulting substrate is heated to cause substitution reaction of Pb and Sn, thereby selectively depositing Pb/Sn alloy on the electrode of the substrate.

The solder formation technique disclosed in Patent Document 1, however, is intended to prevent a short circuit between adjusting terminals and also provide an appropriate wettability for metal by controlling surface oxidation of solder powder. However, it is difficult to control the essentially contradictory properties only by the oxidation amount and the oxidation method. In addition, since the material for the chemical deposition type solder used in Patent Document 2 is prepared by utilizing a specific chemical reaction, the flexibility in selection of solder composition is low. Therefore, it still has a problem in handling of Pb-free solder.

In the conventional flip-chip packaging employing a bump formation technique, a semiconductor chip is mounted to a wiring substrate formed with a bump. Then, in order to fix the semiconductor chip to the wiring substrate, the process of injecting a resin called an underfill into a space between the semiconductor chip and the wiring substrate is additionally required.

From the circumstances described above, a flip-chip packaging technique (see, for example, Patent Document 3) using an anisotropic conductive material is developed as a method for simultaneously making an electrical connection between the semiconductor chip and opposed electrode terminals of the wiring substrate and fixing the semiconductor chip to the wiring substrate. In this technique, thermosetting resin having conductive particles contained therein is supplied to a space between the wiring substrate and the semiconductor chip, and then pressurization of the semiconductor chip and heating of the thermosetting resin are simultaneously performed to simultaneously make an electrical connection between the semiconductor chip and the electrode terminals of the wiring substrate and fix the semiconductor chip to the wiring substrate.

[Patent Document 1] Japanese Unexamined Patent Publication No. 2000-94179
[Patent Document 2] Japanese Unexamined Patent Publication No. H1-157796
[Patent Document 3] Japanese Unexamined Patent Publication No. 2000-332055

DISCLOSURE OF INVENTION

Problems to be Solved by the Invention

In the above-mentioned flip-chip packaging using an anisotropic conductive material, however, mechanical contact through the conductive particles establishes electrical continuity between the electrodes, which makes it difficult to ensure a stable electrical continuity.

Moreover, since the conductive particles interposed between the opposed electrodes are held by cohesion generated by thermosetting of resin, it is necessary to equalize the properties of the thermosetting resin, such as the modulus of elasticity and the coefficient of thermal expansion, the properties of the conductive particles, such as the particle size distribution. This causes a problem that process control becomes difficult.

That is to say, in consideration of application to a next-generation LSI chip having connection terminals as great as 5000 or more, the flip-chip packaging using an anisotropic conductive material still has many productivity- and reliability-related problems to be solved.

The present invention has been made in view of the above point, and its main object is to provide a highly reliable, high-productivity package (flip-chip package) and a production method thereof.

Means for Solving the Problems

A package according to the present invention includes: a semiconductor chip; and a mounting substrate above which the semiconductor chip is mounted. A plurality of electrode terminals are formed on the surface of the semiconductor chip opposing the mounting substrate side, electrode terminals corresponding to the plurality of electrode terminals, respectively, are formed on the mounting substrate, the electrode terminals on the mounting substrate and the electrode terminals are electrically connected collectively by solder bumps formed in self-assembly, an electrode pattern not connected to the electrode terminals and the connection terminals is formed on at least either of the chip surface and the surface of the mounting substrate corresponding to the chip surface, and solder is accumulated on the electrode pattern.

In one preferred embodiment, the electrode terminals are disposed on an edge region of the chip surface of the semiconductor chip, and the electrode pattern is formed in a region of the mounting substrate corresponding to a center region of the chip surface.

The electrode terminals are two-dimensionally arranged on the chip surface of the semiconductor chip, and the electrode pattern is formed on at least either of a center region of the chip surface and a region of the mounting substrate corresponding to the center region of the chip surface.

In one preferred embodiment, the electrode pattern is formed on a solder resist formed on the mounting substrate.

In one preferred embodiment, the electrode terminals are formed on one side of the chip surface of the semiconductor chip, and the electrode pattern is formed on at least either of another region of the chip surface located on the opposite side to the one side and a region of the mounting substrate corresponding to another said region.

In one preferred embodiment, resin fills a space between the semiconductor chip and the mounting substrate, and each of the solder bumps is made of solder powders formed in self-assembly between the electrode terminal and the connection terminal, the solder powders being contained in the resin in a dispersed state.

In one preferred embodiment, the solder accumulated on the electrode pattern is made of solder powders formed in self-assembly on the electrode pattern, the solder powders being contained in the resin in a dispersed state.

The electrode pattern is formed simultaneously with the connection terminal of the mounting substrate or the electrode terminal of the semiconductor chip, and made of the same material as the connection terminal or the electrode terminal simultaneously formed therewith.

Electronic equipment according to the present invention includes the package described above.

A method for producing a package according to the present invention is characterized in that it includes: the step (a) of preparing a semiconductor chip having a chip surface on which electrode terminals are arranged; the step (b) of preparing a mounting substrate having connection terminals and an electrode pattern, the connection terminals being arranged to correspond to the electrode terminals of the semiconductor chip, respectively, the electrode pattern not being electrically connected to the connection terminals; the step (c) of applying, onto the mounting substrate, a solder resin paste with solder powders contained in resin; the step (d) of disposing the semiconductor chip above the mounting substrate with the solder resin paste interposed therebetween; and the step (e) of collectively and electrically connecting the electrode terminals of the semiconductor chip and the connection terminals formed on the mounting substrate to correspond to the electrode terminals, respectively, by heating the solder resin paste to self-assemble the solder powders in the solder resin paste, and in the step (e), a surplus of the solder powders is accumulated on the electrode pattern.

Another method for producing a package according to the present invention is characterized in that it includes: the step (a) of preparing a semiconductor chip having a chip surface on which electrode terminals are arranged; the step (b) of preparing a mounting substrate having connection terminals arranged to correspond to the electrode terminals of the semiconductor chip, respectively; the step (c) of applying, onto the mounting substrate, a solder resin paste with solder powders contained in resin; the step (d) of disposing the semiconductor chip above the mounting substrate with the solder resin paste interposed therebetween; and the step (e) of collectively and electrically connecting the electrode terminals of the semiconductor chip and the connection terminals formed on the mounting substrate to correspond to the electrode terminals, respectively, by heating the solder resin paste to self-assemble the solder powders in the solder resin paste, the chip surface of the semiconductor chip prepared in the step (a) is formed with an electrode pattern not electrically connected to the connection terminals, and in the step (e), a surplus of the solder powders is accumulated on the electrode pattern.

In one preferred embodiment, the solder resin paste further contains, in the resin, a convection-inducing additive which boils when the resin is heated, and by heating the solder resin paste in the step (e), the convection-inducing additive is boiled to generate convection in the resin, thereby self-assembling the solder powders in the solder resin paste.

In one preferred embodiment, the semiconductor chip prepared in the step (a) is a peripheral-type chip in which the electrode terminals are arranged on an edge region of the chip surface.

In one preferred embodiment, the solder powders contained in the solder resin paste have a greater amount than solder which forms solder bumps serving as connecting members for collectively and electrically connecting the electrode terminals and the connection terminals.

Technical Advantages

With the present invention, in a package equipped with a mounting substrate above which a semiconductor chip is mounted, connection terminals on the mounting substrate and electrode terminals of the semiconductor chip are electrically connected collectively by solder bumps formed in self-assembly, an electrode pattern not connected to the electrode terminals and the connection terminals is formed on at least either of the chip surface of the semiconductor chip and the surface of the mounting substrate corresponding to the chip surface, and solder is accumulated on the electrode pattern. Therefore, even though great amounts of solder powders are provided, the electrode pattern can selectively accumulate a surplus of the solder powders. This provides the effect of preventing troubles such as an electrical short circuit between the adjacent electrodes or a short circuit between connections. Accordingly, a highly reliable, high-productivity package can be provided.

EXPLANATION OF REFERENCES 10 semiconductor chip
10a chip surface (electrode formation surface)
12 electrode terminal
13 solder resin paste
14 connection terminal
17 solder bump
19 solder accumulation
20 electrode pattern
21 center region
30 mounting substrate
31 center region
32 connection terminal
35 chip placing portion
40 convection
50 solder resist
100 package
110 circuit substrate
111 connection terminal (electrode)
112 convection-inducing additive
113 resin
114 plate
120 semiconductor chip
121 electrode terminal
122 solder bump
122 connecting element
130 convection
131 vapor
132 growing solder ball

BEST MODE FOR CARRYING OUT THE INVENTION

The applicants of the present invention developed an original technique capable of carrying out solder bump formation or flip-chip packaging by self-assembling solder under a predetermined condition, and disclosed this technique in Japanese Patent Applications Nos. 2004-257206 and 2004-267919. Herein, the solder bump formation technique by self-assembly will be described briefly with reference to FIGS. 1(a) to 1(c).

Figure 1A:
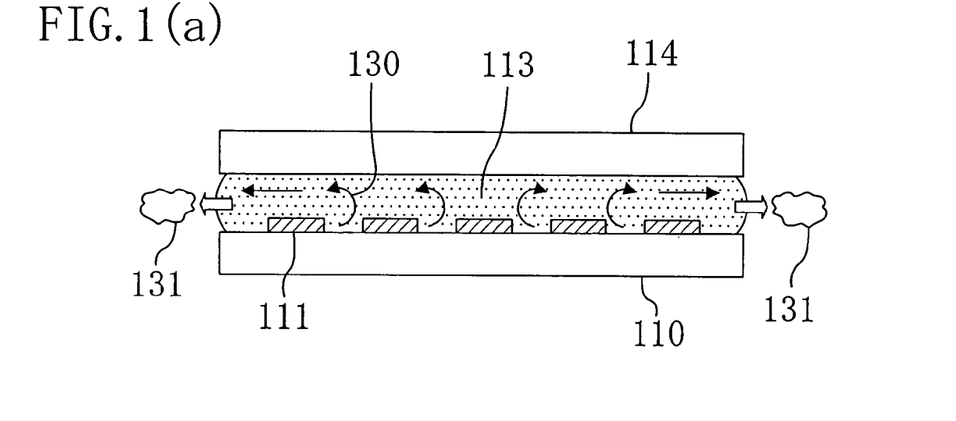
FIGS. 1(a) to 1(c) are sectional views for explaining production steps disclosed in Japanese Patent Application No. 2004-257206.

FIG. 1(a) shows a structure produced in the manner in which after a resin 113 containing solder powders and a convection-inducing additive is supplied onto a substrate 110, a plate 114 abuts the surface of the resin 113 and the substrate 110 is heated to a temperature at which the solder powders melt. In FIG. 1(a), illustration of the solder powders and the convection-inducing additive contained in the resin is omitted.

When the heating temperature of the substrate is set higher than the boiling point of the convection-inducing additive, heating of the substrate melts the solder powders and also boils the convection-inducing additive. As a result, the boiled convection-inducing additive turns into gas and is circulated by convection within the resin 113 like the arrows shown in FIG. 1(a) (the arrow 130). The convection induced by the boiled convection-inducing additive accelerates movement of the molten solder powders within the resin, and thereby binding of the solder powders proceeds uniformly.

Figure 1B:
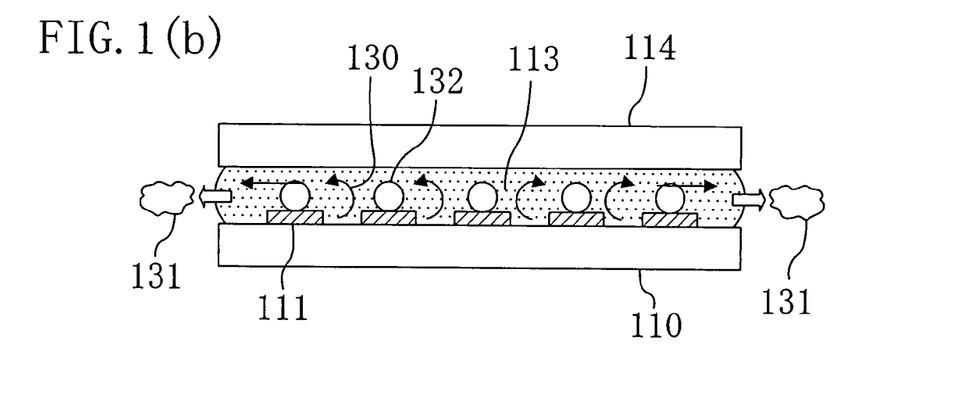
Figure 1C:
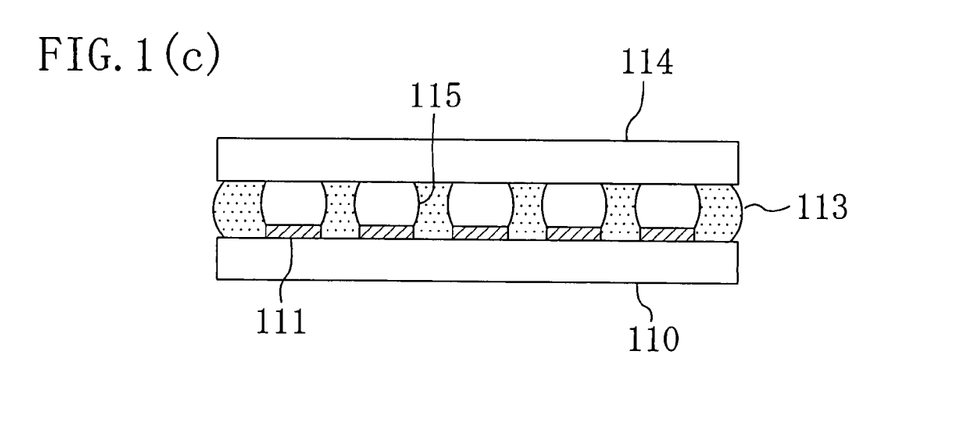

As shown in FIG. 1(b), the molten solder powders bind and grow into solder balls 132 with a uniform size. Since the molten solder powders have a high solder wettability with respect to an electrode 111 and a low solder wettability with respect to the substrate 110, the grown solder balls 132 self-assemble selectively on the electrode 111. When the self-assembly proceeds one after another, the solder ball 132 produced on the electrode 111 grows into a size enough to touch with the plate 114 as shown in FIG. 1(c). As a result, solder balls (bumps) 115 with a uniform size are formed on the electrodes 111, respectively.

Note that the directions of the convection by the convection-inducing additive, which is shown in the arrows in FIGS. 1(a) and 1(b), are schematically shown. It is observed that as shown in FIGS. 1(a) and 1(b), the boiled convection-inducing additive evaporates as a form of vapor 131 from around a gap provided between the substrate 110 and the plate 114 to the outside. In this description, "convection" included in the term "convection-inducing additive" indicates convection as one form of movement, and any form of movement is acceptable as long as it has the function of accelerating movement of the solder powders in the manner in which the boiled convection-inducing additive makes a movement in the resin 113 to give kinetic energy to the solder powders dispersing in the resin 113.

Figure 2A:
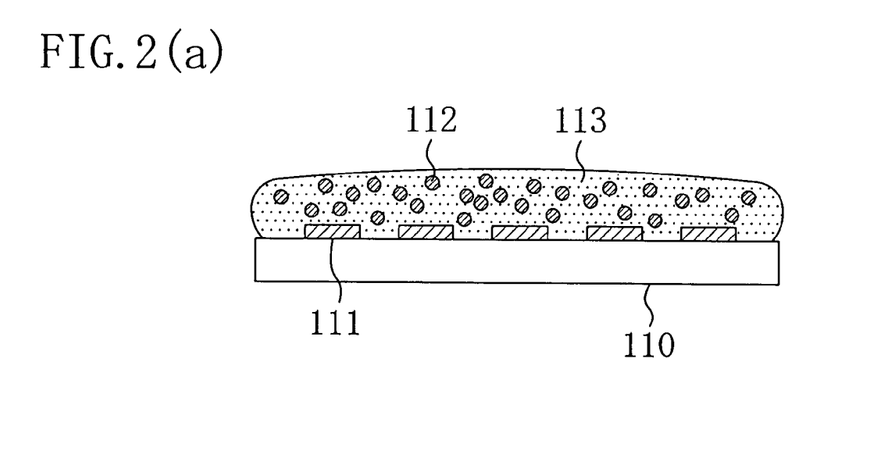
FIGS. 2(a) to 2(c) are sectional views for explaining production steps disclosed in Japanese Patent Application No. 2004-267919.
Figure 2B:
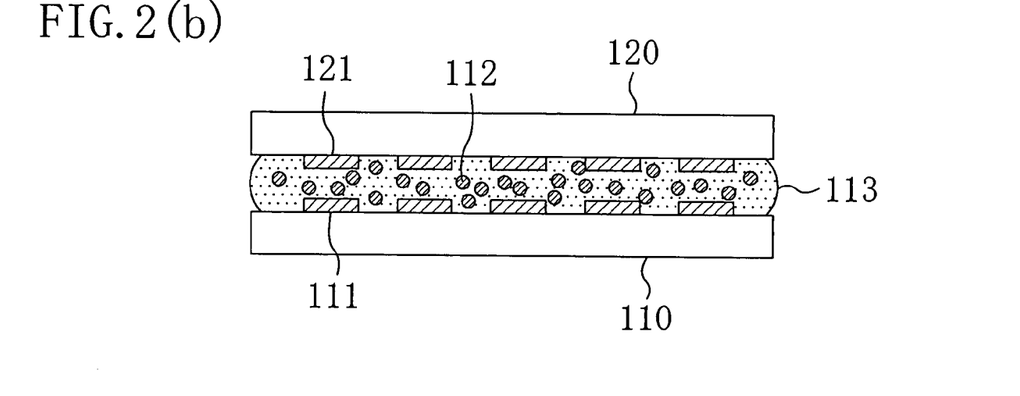
Figure 2C:
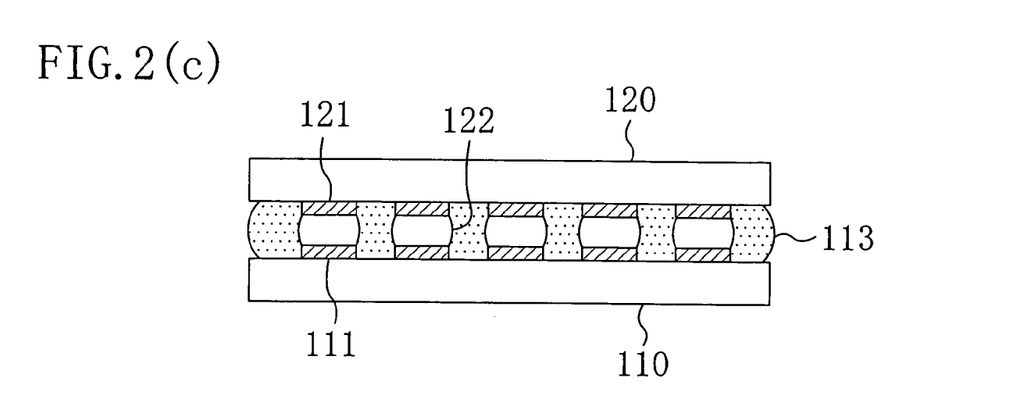

When this solder bump formation is applied to the flip-chip packaging technique, a process as shown in FIGS. 2(a) to 2(c) is obtained.

Referring to FIG. 2(a), first, resin 113 containing metal particles that are not shown (for example, solder powders)

and a convection-inducing additive 112 is supplied onto a circuit substrate 110 formed with a plurality of connection terminals 111. Note that similarly to the structure describes above, the convection-inducing additive 112 is an additive for generating convection by boiling itself when the resin 113 is heated.

Next, as shown in FIG. 2(b), a semiconductor chip 120 with a plurality of electrode terminals 121 abuts the surface of the resin 113. In this abutment, the electrode terminals 121 of the semiconductor chip 120 are disposed to face the connection terminals 111 of the circuit substrate 110, respectively. In the state of this abutment, the resin 113 is heated. During the heating, the heating temperature of the resin 113 used is higher than the melting point of the metal particle and the boiling point of the convection-inducing additive 112.

The metal particles melted by the heating bind to one another in the resin 113, and then are self-assembled between the connection terminal 111 and the electrode terminal 121 both of which have high solder wettabilities as shown in FIG. 2(c). Thereby, a connecting element 122 is formed which electrically connects the electrode terminal 121 of the semiconductor chip 120 and the connection terminal 111 of the circuit substrate 110. Thereafter, the resin 113 is cured to fix the semiconductor chip 120 to the circuit substrate 110.

The technique developed by the applicants of the present invention is characterized in that in heating the resin 113, the convection-inducing additive 112 contained in the resin 113 boils, and the boiled convection-inducing additive 112 generates convection in the resin 113 to accelerate movement of the metal particles dispersing in the resin 113. This causes uniform binding of metal particles, whereby the connecting elements (solder bumps) 122 can be formed in self-assembly. In this mechanism, it is conceivable that the resin 113 serves as "expanse" within which the metal particles can suspend and move freely. However, the binding process of the metal particles completes in an extremely short time. Therefore, even though "expanse" within which the metal particles can move freely is provided, only local binding thereof can proceed. As a result of this, combination of the resin 113 serving as "expanse" and convection induced by the convection-inducing additive 112 forms the solder bump 122 in self-assembly. Note that formation of the solder bump 122 is made not only in self-assembly but also in self alignment as the property of the solder bump.

Figure 3:
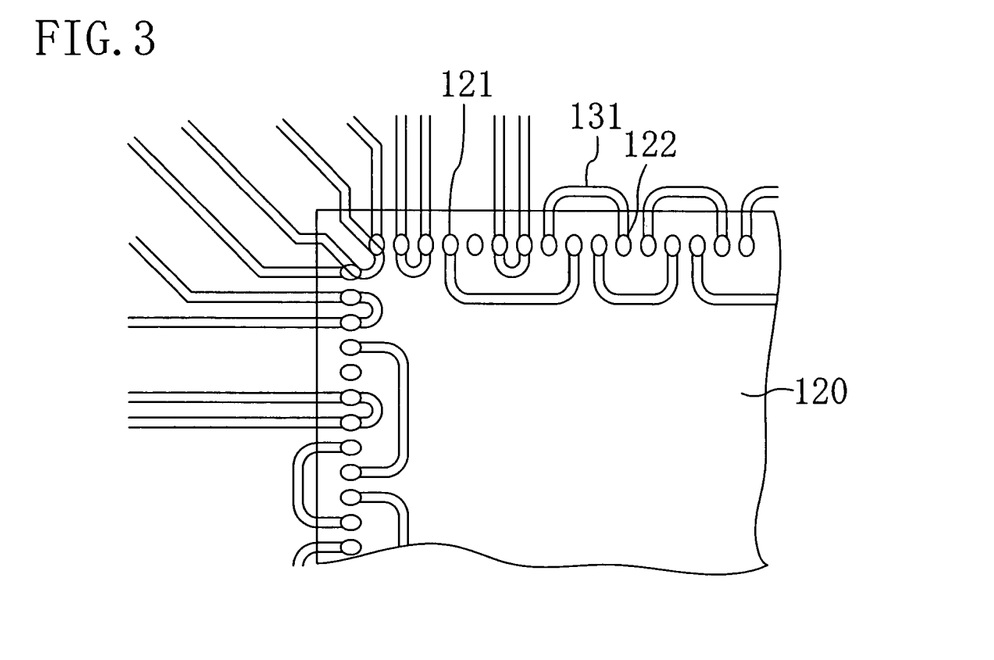
FIG. 3 is a plan view perspectively showing a semiconductor chip in a peripheral arrangement.
Figure 4:
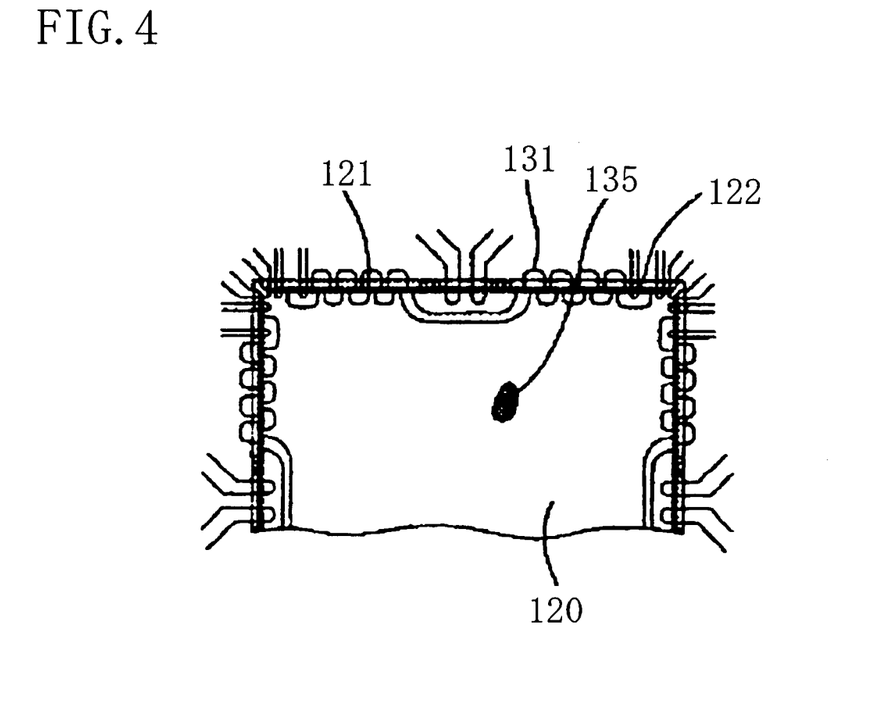
FIG. 4 is a plan view perspectively showing a semiconductor chip in a peripheral arrangement.

FIGS. 3 and 4 are perspective views showing the semiconductor chip 120 in a peripheral arrangement in which the electrode terminal 121 is formed in a peripheral portion of the chip surface. In the example shown in FIG. 3, the solder bumps 122 are formed appropriately on the electrode terminals 121, respectively, while in the example shown in FIG. 4, an accumulated solder waste 135 remains. With the flip-chip packaging technique shown in FIGS. 2(a) to 2(c), the occurrence of the accumulated solder waste 135 can be avoided as long as if an appropriate condition is set. However, if great amounts of solder powders are contained in the resin 113, a surplus of the solder powders tends to be formed into the accumulated solder waste 135. In particular, as shown in FIGS. 1(a) and 1(b), by the effect of the vapor 131 made from the convection-inducing additive, surplus solder powders present in the peripheral portion are easily emitted to the outside. However, surplus solder powders present in the center portion are probably formed into the accumulated solder waste 135. Such probability is stronger in the semiconductor chip in the peripheral arrangement than in the semiconductor chip in an area array arrangement. Although some accumulated solder wastes 135 cause no trouble, some solder accumulated solder wastes located close to the connection terminal may cause a short-circuit trouble.

Hence, the applicants of the present invention made a keen examination of the contents of the self-assembled flip-chip technique in order to solve this solder accumulation problem. As a result of this, they have found a solution to this problem and disclosed it in the present invention.

Hereinafter, an embodiment of the present invention will be described with reference to the accompanying drawings. In the following drawings, for simplification of description, the components having substantially the same function retain the same reference numeral. The present invention is not limited to the embodiment that follows.

A package 100 and a production method thereof according to this embodiment of the present invention will be described with reference to FIGS. 5 to 7.

Figure 5:
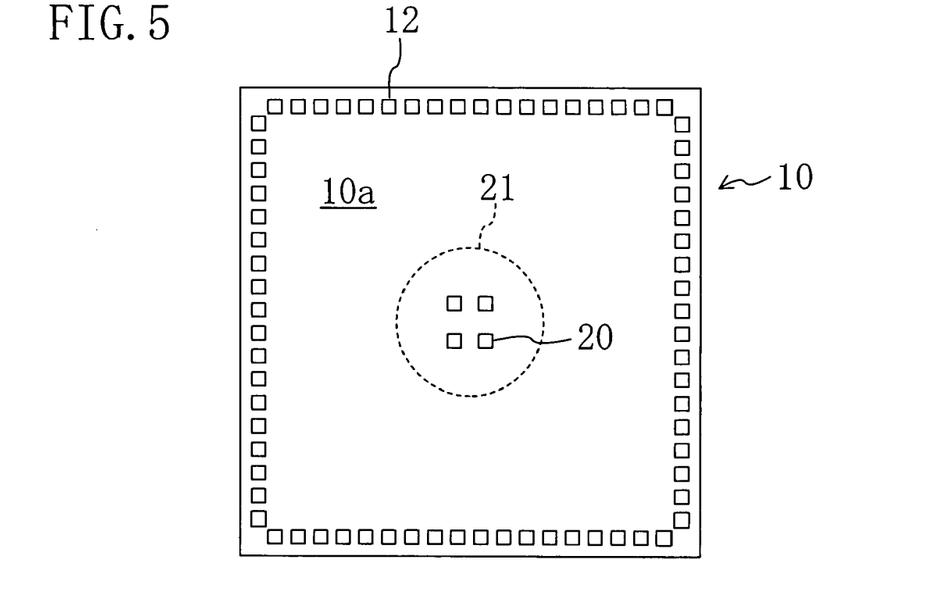
FIG. 5 is a plan view schematically showing an electrode formation surface of a semiconductor chip used in a package according to an embodiment of the present invention.

FIG. 5 schematically shows a plan structure of an electrode formation surface 10a of a semiconductor chip 10 employed in a package 100 according to this embodiment. In the semiconductor chip 10 shown in FIG. 5, the chip surface (the electrode formation surface) 10a opposing the mounting substrate side is formed with a plurality of electrode terminals (electrode pads) 12. The chip surface 10a is further formed with an electrode pattern 20 not connected to any electrode terminals 12. As will be described later in detail, solder is accumulated on the electrode pattern 20, which prevents a short circuit by the accumulated solder waste ("135" in FIG. 4).

In this description, the wording "an electrode pattern not connected to any electrode terminals" typically indicates a dummy pad that is not in use. However, it also includes the component having a different function from the electrode terminal, such as a terminal for inspection and a terminal for coming into contact with a grounding component. This is because solder is also accumulated on these terminals and thereby the function and the effect of preventing short circuit due to the accumulated solder waste can be provided.

In this example, the electrode terminals 12 are disposed in an edge region of the chip surface 10a of the semiconductor chip 10, while the electrode pattern 20 is formed in a center region 21 thereof. In the region (21) formed with the electrode pattern 20, the electrode terminal 12 is not formed. Note that in the illustrated structure, the electrode pattern 20 and the electrode terminal 12 are formed of patterns having the same shape or the same area. The use of the same pattern enhances the convenience of design and production of the package.

The position where the electrode pattern 20 is to be arranged or the number of electrode patterns 20 to be arranged differs according to the arrangement conditions of the electrode terminals 12 (size, pitch, and the like), the yield to be demanded, or the like. However, as a general guideline, preferably, a predetermined number of electrode patterns 20 are arranged so that the electrode terminals 12 including the electrode pattern 20 are dispersed in the semiconductor chip 10 as uniformly as possible.

Although in the structure shown in FIG. 5, the chip surface 10a of the semiconductor chip 10 is formed with the electrode pattern 20, it is also possible to provide the electrode pattern 20 for accumulating surplus solder on the mounting substrate side. FIG. 6 schematically shows a plan structure of a mounting substrate 30 formed with the electrode pattern 20.

Figure 6:
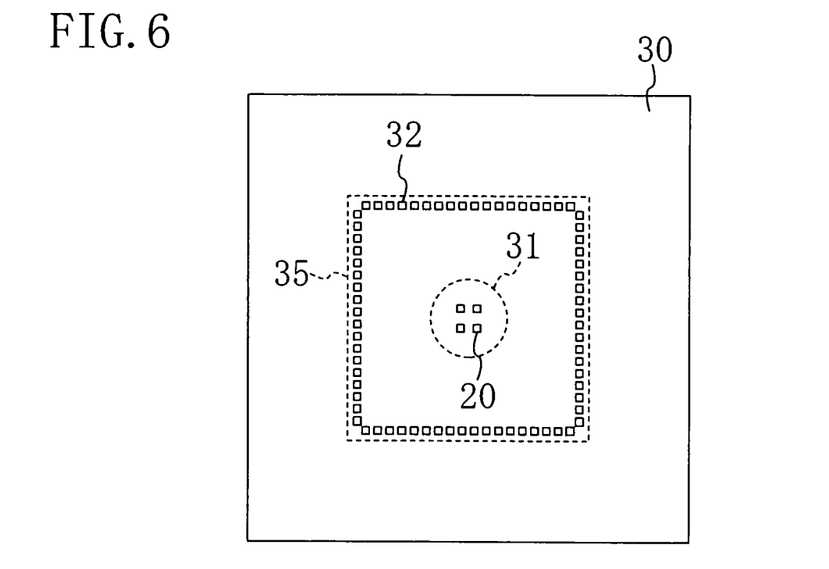
FIG. 6 is a plan view schematically showing a mounting substrate used in a package according to the embodiment of the present invention.

The mounting substrate 30 shown in FIG. 6 is formed with connection terminals 32 associated with the electrode terminals 12 of the semiconductor chip 10. In this example, the connection terminals 32 are formed in an edge region of a chip placing portion 35 of the mounting substrate 30. On the other hand, the electrode pattern 20 for accumulating surplus solder is formed in a center region 31 of the chip placing portion 35. The connection terminal 32 is not formed in the center region 31. Also in this example, the electrode pattern 20 and the connection terminal 32 are formed in the same shape.

In general, the mounting substrate 30 has a lower wiring pattern density than the semiconductor chip 10. Therefore, arrangement of the electrode pattern 20 on the side of the mounting substrate 30 more easily secures a sufficient margin. Furthermore, when the electrode pattern 20 is formed above a wiring pattern formed in the semiconductor chip 10 with an insulating film interposed therebetween, it may serve as a source of unwanted noise or parasitic capacitance. From this possibility, the electrode pattern 20 is preferably formed on the side of the mounting substrate 30.

An example of implementation of the fabrication method of this embodiment will be described using the mounting substrate 30 as in FIG. 6 that is formed with the electrode pattern 20 for accumulating surplus solder.

Figure 7A:
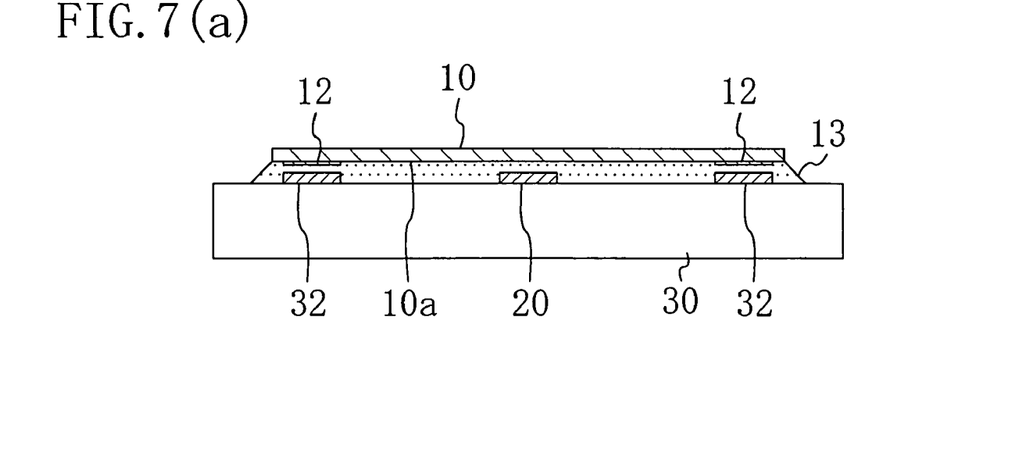
FIGS. 7(a) to 7(c) are sectional views for explaining production steps of a method for producing a package according to the embodiment of the present invention.

Referring to FIG. 7(*a*), first, the mounting substrate 30 is prepared which is formed with the electrode pattern 20 for accumulating surplus solder and the connection terminals 32. Onto the mounting substrate 30, a solder resin paste 13 with solder powders and a convection-inducing additive added into the resin is applied and the semiconductor chip 10 is mounted. The chip surface 10*a* of the semiconductor chip 10 is formed with the electrode terminals 12. The convection-inducing additive is an additive, such as organic solvent, that boils when the resin is heated.

Figure 7B:
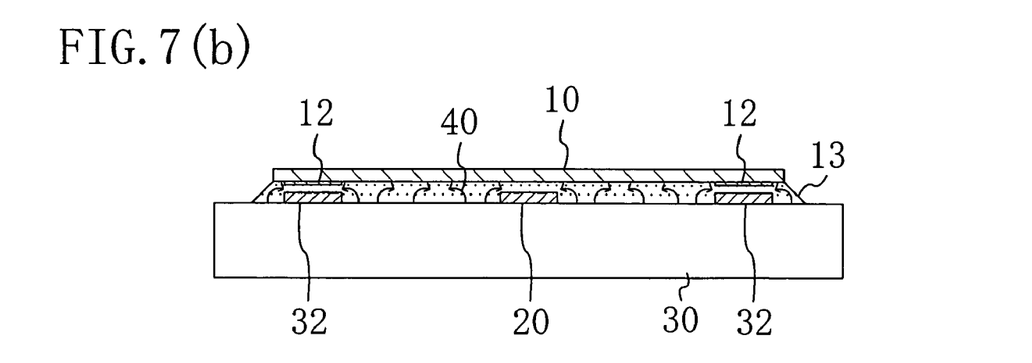
Figure 7C:
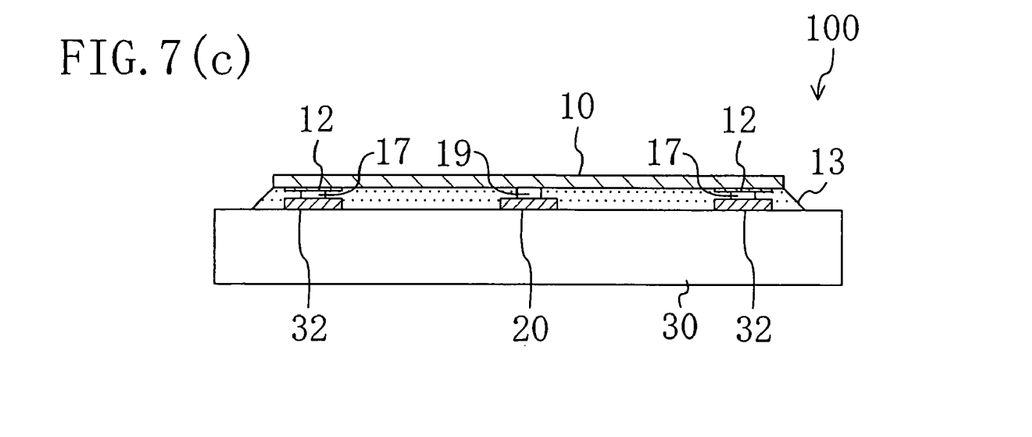

Next, when the solder resin paste 13 is heated, the convection-inducing additive in the solder resin paste 13 boils and resulting convection 40 is generated in the resin as shown in FIG. 7(*b*). Then, as shown in FIG. 7(*c*), the solder powders in the solder resin paste 13 are self-assembled to form a solder bump 17. By the solder bump 17, the electrode terminal 12 of the semiconductor chip 10 is electrically connected collectively to the connection terminal 32 of the mounting substrate 30.

In this embodiment, the electrode pattern 20 is formed separately from the connection terminal 32. Therefore, during the self-assembly step shown in FIGS. 7(*b*) and 7(*c*), a surplus of the solder powders is accumulated on the electrode pattern 20 to form a solder accumulation 19. From this, the occurrence of an accumulated solder waste due to the surplus solder powders can be prevented. In the manner described above, the package 100 of this embodiment is provided.

In the production method shown in FIGS. 7(*a*) to 7(*c*), the construction in which the electrode pattern 20 is formed on the mounting substrate 30 is employed, but the construction shown in FIG. 5 in which the electrode pattern 20 is formed on the semiconductor chip 10 can also be employed. Alternatively, the electrode pattern 20 may be formed on both of the semiconductor chip 10 and the mounting substrate 30. The number of electrode patterns 20 provided may be one, or two or more as shown in FIG. 5 or 6.

In the construction of this embodiment, the connection terminal 32 of the mounting substrate 30 and the electrode terminal 12 are electrically connected collectively by the solder bump 17 formed in self-assembly. The solder bump (solder member) 17 formed in self-assembly is formed not by arranging a previously-formed solder bump on the electrode terminal 12 but by performing the predetermined processes described above to grow the solder bump between the electrode terminal 12 and the connection terminal 14.

Metal (solder) forming the solder bump (solder member) 17 is low melting point metal, for example, Sn—Ag based solder (which includes solder with Cu or the like added thereto). It is not limited to Sn—Ag based solder (which includes solder with Cu or the like added thereto), and low melting point metal with a melting point of 100 to 300° C. can be used thereas. For example, as another solder powders, use can be made of Pb-free solder such as Sn—Zn based solder or Sn—Bi based solder, Pb—Sn eutectic solder, low melting point metal such as Cu—Ag alloy, or the like. The solder bump 17 can have a substantially spherical shape with a swollen portion in the middle as shown in FIG. 1 or 2, or in contrast to this, a drum shape with a constricted portion in the middle. However, in FIG. 7, it is shown in a columnar shape for easy illustration. The shape of an actual solder bump 17 is determined according to various conditions.

The solder (solder powders) for forming the solder bump 17 is contained in the solder resin paste 13. The amount of the solder powders in the solder resin paste 13 is greater than the amount of solder which forms the solder bump 17 electrically connecting the electrode terminal 12 and the connection terminal 32 collectively. This is because all amounts of the solder powders in the solder resin paste 13 are not formed into the solder bump 17 and some amounts of the solder powders are emitted to the outside by convection generated from the convection-inducing additive and vapor ("131" in FIG. 1). Furthermore, in consideration of the influence of such emission, surplus solder powders are contained in the solder resin paste 13. However, in the construction of this embodiment, formation of the electrode pattern 20 can avoid the accumulated solder waste problem due to the surplus solder.

The mounting substrate 30 shown in FIG. 7 is a rigid substrate (typical printed circuit board). The connection terminal 32 formed on the mounting substrate 30 is made of copper or the like and serves as part of a wiring circuit. From the viewpoint of the formation process of the mounting substrate 30, preferably, the electrode pattern 20 is made of the same material as the connection terminal 32. However, another material (for example, metal such as gold-, copper-, or tin-based alloy) can also be used if solder can be accumulated thereon. As the mounting substrate 30, a flexible substrate can also be used.

The semiconductor chip 10 in this embodiment is, for example, a bare chip. The thickness of the bare chip 10 is, for example, 50 to 400 μm. In order to reduce the height of the package 100, preferably, a thin semiconductor chip with a thickness of 100 μm or smaller is used as the semiconductor chip 10. In consideration of the effect of avoiding the occurrence of accumulated solder waste, the semiconductor chip 10 can be preferably used which has the electrode terminals 12 arranged in the edge region of the chip surface 10*a* (peripheral arrangement). Alternatively, the technique according to this embodiment is also applicable to the semiconductor chip 10 in area array arrangement. The electrode terminal 12 is made of, for example, aluminum. In the case of forming the electrode pattern 20 on the side of the semiconductor chip 10, the same material as the electrode terminal 12 can be used thereas. However, a different material from the electrode terminal 12 (for example, metal such as gold-, copper-, or tin-based alloy) can also be used thereas if solder can be accumulated thereon.

The resin 13 shown in FIG. 7(*c*) serves as an underfill in the flip-chip packaging. In this example, thermosetting resin such as epoxy resin is used as the resin 13. In this embodiment, the solder resin paste 13 containing the solder powders (not shown) and the convection-inducing additive (not shown) which boils in heating the resin is applied onto the mounting substrate 30, and then the semiconductor chip 10 is disposed over the mounting substrate 30 with the solder resin paste 13 interposed therebetween. Alternatively, the solder resin paste 13 may be provided, like filling with an underfill, by filling with it a space between the semiconductor chip 10 and the mounting substrate 30. In addition, as illustrated in the drawing, the solder resin paste 13 is applied to cover the chip surface (electrode formation surface) 10a of the semiconductor chip 10 and part of the mounting substrate 30 (a portion including the connection terminals 32).

As described above, the solder resin paste 13 in this embodiment contains, in the resin, the solder powders and the convection-inducing additive which boils in heating the resin. In other words, the solder resin paste 13 is composed of the resin, the solder powders (not shown) dispersed in the resin, and the convection-inducing additive (not shown) which boils in heating the resin. In this embodiment, thermosetting resin (for example, epoxy resin) is used as the resin, and Pb-free solder powders are employed as the solder powders. Solvent (for example, high boiling point organic solvent) can be used as the convection-inducing additive, and examples thereof include isopropyl alcohol, butyl acetate, butyl carbitol, ethylene glycol, or the like. Although there is no particular limitation to the content of the convection-inducing additive in the resin, 0.1 to 20% additive by weight is preferably contained in the resin.

As described above, "convection" included in the term "convection-inducing additive" indicates convection as one form of movement, and any form of movement is acceptable as long as it has the function of accelerating movement of metal particles (solder powders) in the manner in which the boiled convection-inducing additive makes a movement in the resin to give kinetic energy to the metal particles dispersing in the resin. As the convection-inducing additive, use can be made of not only the convection-inducing additive capable of generating convection by boiling itself but also the convection-inducing additive capable of generating gas (such as $H_2O$, $CO_2$, or $N_2$) by heating the resin. Examples thereof include a compound containing water of crystallization, a compound decomposing by heating, and a foaming agent.

The period of time for formation of the solder bump 17 in FIGS. 7(b) and 7(c) varies according to the conditions, and is, for example, about 5 to 30 seconds (typically about five seconds). In the formation of the solder bump 17, a preheating process for heating the solder resin paste 13 in advance can be introduced.

Formation of the solder bump 17 is made not only in self-assembly but also in self alignment with respect to the electrode terminal 12 and the connection terminal 14. Therefore, the position of the solder bump 17 is not substantially shifted from the electrode terminal 12 and the connection terminal 14, and the solder bump 17 is formed to automatically handle the patterns of the electrode terminal 12 and the connection terminal 14.

Moreover, the solder bump 17 is formed in the manner in which the solder powders in the solder resin paste 13 self-assemble. Therefore, after formation of the solder bump 17, the conductive particles are not contained substantially in the resin constituting the solder resin paste 13, and the adjacent solder bumps 17 are insulated from each other by the resin 13 in FIG. 7(c). By heating, the convection-inducing additive turns into gas and then is emitted to the outside for removal from the solder resin paste 13. After formation of the solder bump 17, it is also possible to wash away the remaining solder resin paste 13 and then fill the resulting space with another resin (the same type of resin can also be used).

By curing the resin constituting the solder resin paste 13 (or another resin), the package 100 of this embodiment shown in FIG. 7(c) can be provided. However, in the case of the filling with another resin, resin other than thermosetting resin (such as thermoplastic resin or photosetting resin) can also be used as the resin constituting the solder resin paste 13.

Figure 8A:
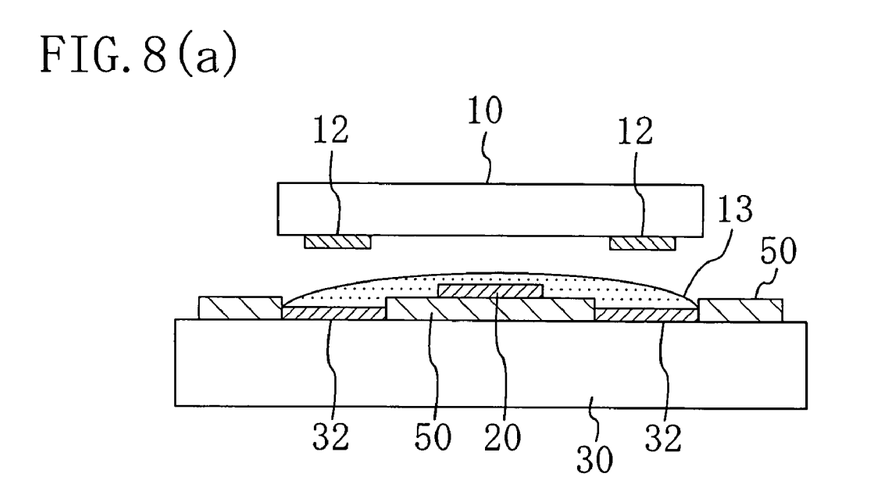
FIGS. 8(a) and 8(b) are sectional views for explaining production steps of the method for producing a package according to the embodiment of the present invention.
Figure 8B:
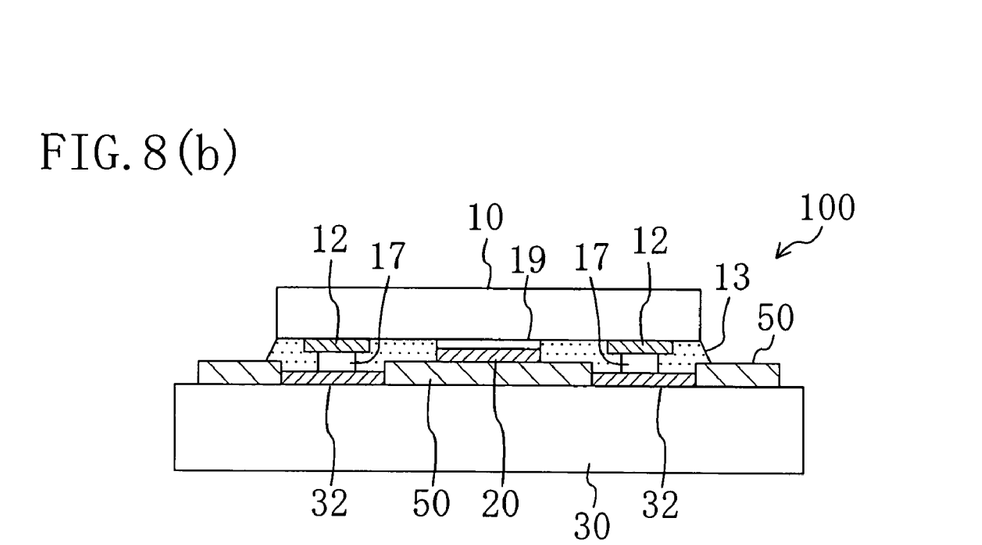

The electrode pattern 20 of this embodiment can also be used so that it is formed on a solder resist. In FIG. 8(a), a solder resist 50 is formed on the mounting substrate 30, and the electrode pattern 20 is formed on the solder resist 50. When the self-assembly step is performed on the structure shown in FIG. 8(a), the package 100 as shown in FIG. 8(b) is provided.

Figure 9A:
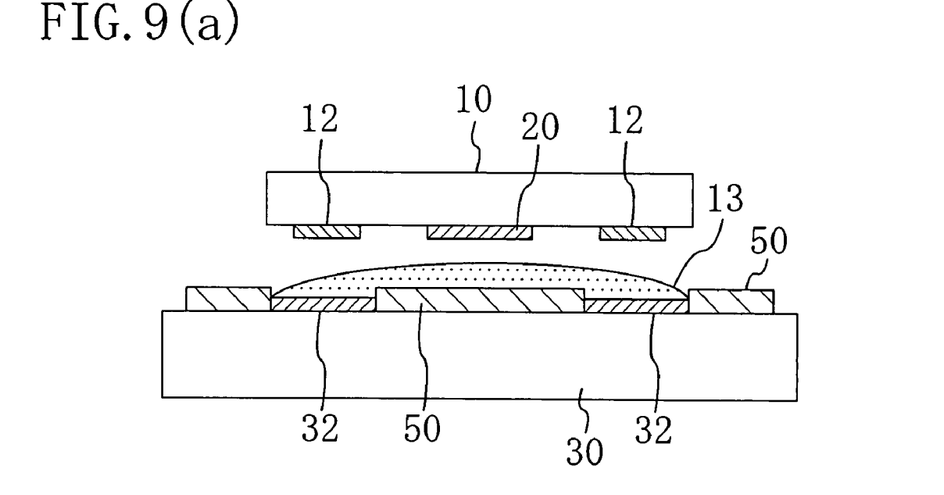
FIGS. 9(a) and 9(b) are sectional views for explaining production steps of the method for producing a package according to the embodiment of the present invention.
Figure 9B:
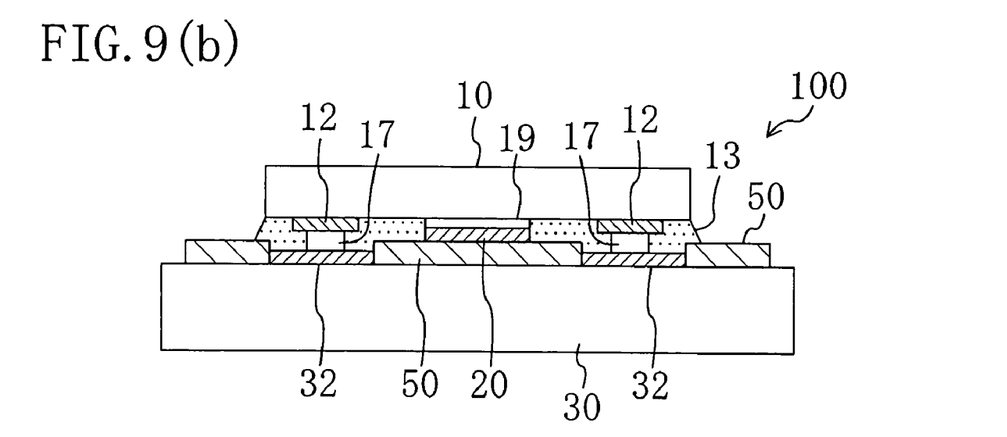

As shown in FIG. 9(a), use may be made of the mounting substrate 30 formed with the solder resist 50 and the semiconductor chip 10 formed with the electrode pattern 20. When the self-assembly step is performed on the structure shown in FIG. 9(a), the package 100 as shown in FIG. 9(b) is provided.

Next, exemplary variations of this embodiment will be described with reference to FIGS. 10 to 13.

Figure 10:
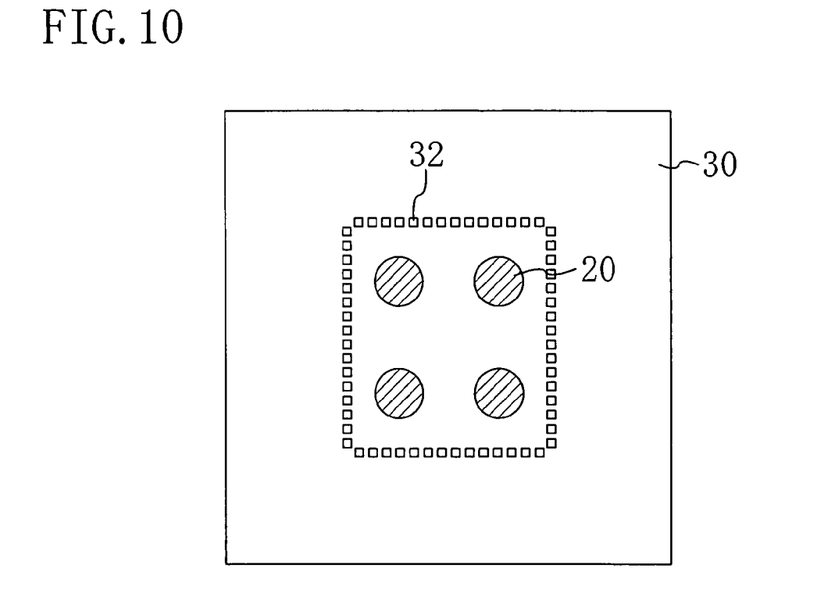
FIG. 10 is a plan view schematically showing a mounting substrate used in the package according to the embodiment of the present invention.

FIG. 10 shows an example in which a circular electrode pattern 20 is formed on the mounting substrate 30. This electrode pattern 20 has a larger area than the connection terminal 32 (for example, three or more times as large as the connection terminal 32), and thus the effect of accumulating surplus solder can be ensured.

Figure 11:
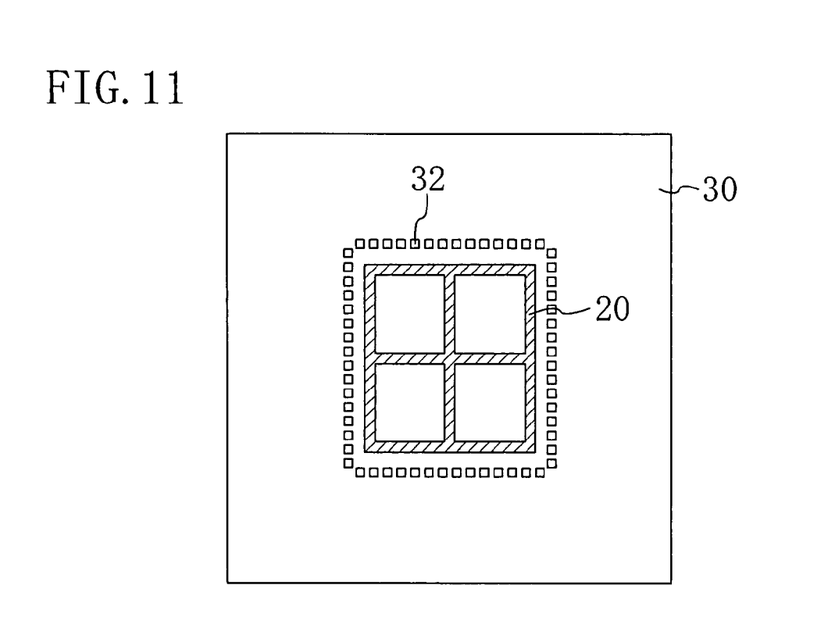
FIG. 11 is a plan view schematically showing a mounting substrate used in the package according to the embodiment of the present invention.

FIG. 11 shows an example in which an unseparated electrode pattern 20 is formed on the mounting substrate 30. In this example, the electrode pattern 20 of an unseparated rectangular shape (a shape of a combination of a cross and a square in this example) is shown. The electrode pattern 20 of such a shape can also be formed, for example, in the shape associated with the boundary of an IP core in the semiconductor chip 10. Depending on the conditions, a shield effect can be additionally provided by solder accumulated on the electrode pattern 20.

Figure 12:
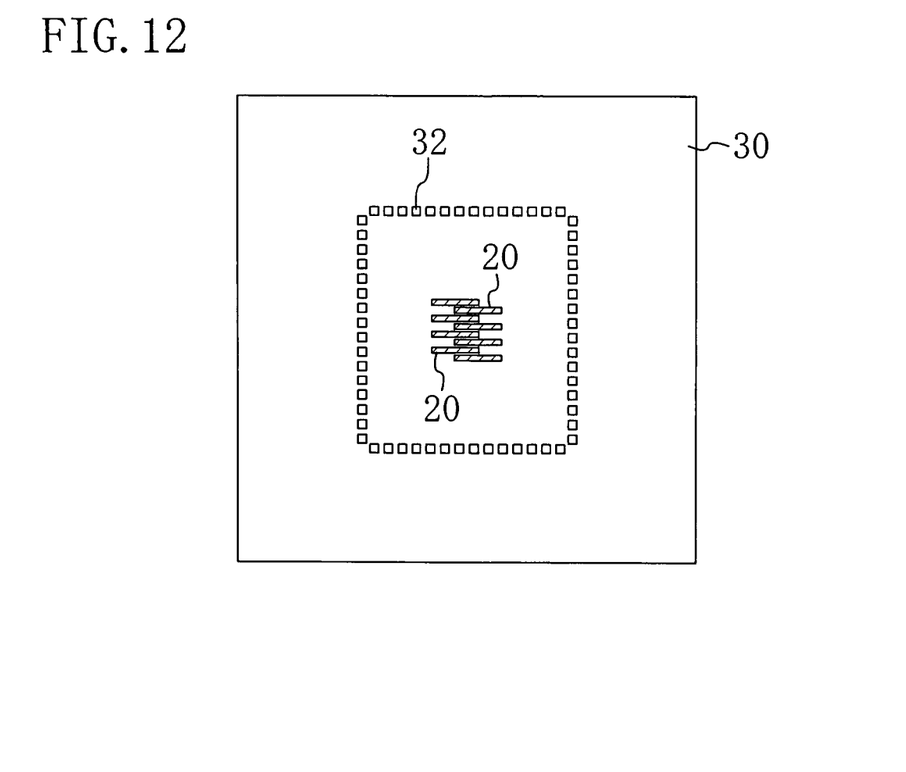
FIG. 12 is a plan view schematically showing a mounting substrate used in the package according to the embodiment of the present invention.

FIG. 12 shows an example in which a comb-like electrode pattern 20 is formed on the mounting substrate 30. Although in this embodiment, the electrode pattern 20 in a geometrically symmetric shape is employed, the electrode pattern 20 in another shape may be employed. However, a shape having geometrical regularity is easier to design, and also possible effects resulting from the shape are estimated more easily.

Figure 13:
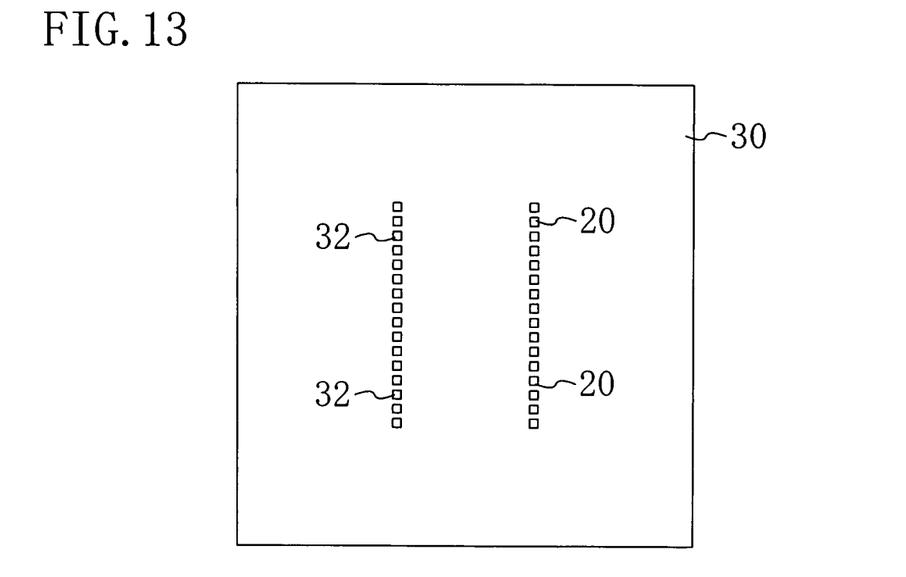
FIG. 13 is a plan view schematically showing a mounting substrate used in the package according to the embodiment of the present invention.

FIG. 13 shows an example of the mounting substrate 30 for applying to one-side electrode IC. In the mounting substrate 30 shown in FIG. 13, the connection terminals 32 are formed which are associated with the semiconductor chip 10 having the electrode terminals 12 formed in a row on one side of the chip surface 10a, and the electrode pattern 20 is formed on the opposite side to the row of the connection terminals 32. The electrode pattern 20 can accumulate surplus solder and reduce deviation in the height of the semiconductor chip 10.

FIGS. 10 to 13 show the examples in which the different electrode patterns 20 are formed on the mounting substrate 30, respectively. Such an electrode pattern 20 may be formed on the chip surface 10a of the semiconductor chip 10.

Up to this point, the present invention has been described by employing the preferred embodiment. However, the above description is not restrictive, and various modifications can be made.

The semiconductor chip 10 is typically a memory IC chip, a logic IC chip, or a system LSI chip, but the chip type is not particularly limited. In the above-described embodiment of the present invention, description has been made of the case where the semiconductor chip (semiconductor element) 10 is a bare chip. However, it is not limited to the bare chip, and for example, a semiconductor package such as a chip size package (CSP) can also be used as the semiconductor chip 10. Moreover, the semiconductor chip 10 may be a module in which a semiconductor element such as a bare chip is modularized using an interposer (intermediate substrate). This module includes a plurality of electrodes (packaging terminals), and examples of this module may include an RF module, a power-supply module, and the like. Note that use may be made of not only the module made by modularization using the interposer but also a component-equipped substrate module provided with a plurality of packaging terminals (for example, SIMPACT™).

It is recommendable to install the package 100 according to the embodiment of the present invention in slim- and small-sized electronic equipment having limitation on packaging area. The package 100 can be installed in not only a cellular telephone but also a PDA or a notebook-sized computer, and it can be employed for another application (for example, a digital still camera, a wall-hanging flat-screen television (FPD; flat-panel display)).

In the production method of the package 100 according to the embodiment of the present invention, the resin containing the convection-inducing additive that boils when the resin is heated is used as the solder resin paste 13. However, even though the solder resin paste 13 not containing the convection-inducing additive is used, formation of the electrode pattern 20 exerts the effect of preventing a short circuit due to accumulated solder waste.

INDUSTRIAL APPLICABILITY

With the present invention, a highly reliable, high-productivity package (flip-chip package) and a production method thereof can be provided.

What is claimed is:

1. A package comprising:
a semiconductor chip; and
a mounting substrate above which the semiconductor chip is mounted,
wherein a plurality of electrode terminals are formed on the surface of the semiconductor chip opposing the mounting substrate side,
connection terminals corresponding to the plurality of electrode terminals, respectively, are formed on the mounting substrate,
the connection terminals on the mounting substrate and the electrode terminals are electrically connected collectively by solder bumps formed in self-assembly, and
an electrode pattern not connected to the electrode terminals and the connection terminals is formed on at least either of the chip surface and the surface of the mounting substrate corresponding to the chip surface, and solder is accumulated on the electrode pattern,
wherein resin fills a space between the semiconductor chip and the mounting substrate, and each of the solder bumps is made of solder powders formed in self-assembly between the electrode terminal and the connection terminal, the solder powders being contained in the resin in a dispersed state.

2. The package of claim 1,
wherein the electrode terminals are disposed on an edge region of the chip surface of the semiconductor chip, and
the electrode pattern is formed in a region of the mounting substrate corresponding to a center region of the chip surface.

3. The package of claim 1,
wherein the electrode terminals are two-dimensionally arranged on the chip surface of the semiconductor chip, and
the electrode pattern is formed on at least either of a center region of the chip surface and a region of the mounting substrate corresponding to the center region of the chip surface.

4. The package of claim 1,
wherein the electrode pattern is formed on a solder resist formed on the mounting substrate.

5. The package of claim 1,
wherein the electrode terminals are formed on one side of the chip surface of the semiconductor chip, and
the electrode pattern is formed on at least either of another region of the chip surface located on the opposite side to the one side and a region of the mounting substrate corresponding to another said region.

6. The package of claim 1,
wherein the solder accumulated on the electrode pattern is made of solder powders formed in self-assembly on the electrode pattern, the solder powders being contained in the resin in a dispersed state.

7. The package of claim 1,
wherein the electrode pattern is formed simultaneously with the connection terminal of the mounting substrate or the electrode terminal of the semiconductor chip, and made of the same material as the connection terminal or the electrode terminal simultaneously formed therewith.

8. Electronic equipment including the package of any one of claims 1-5, 6 and 7.

9. A method for producing a package, comprising:
a step (a) of preparing a semiconductor chip having a chip surface on which electrode terminals are arranged;
a step (b) of preparing a mounting substrate having connection terminals and an electrode pattern, the connection terminals being arranged to correspond to the electrode terminals of the semiconductor chip, respectively, the electrode pattern not being electrically connected to the connection terminals;
a step (c) of applying, onto the mounting substrate, a solder resin paste with solder powders contained in resin;
a step (d) of disposing the semiconductor chip above the mounting substrate with the solder resin paste interposed therebetween; and
a step (e) of collectively and electrically connecting the electrode terminals of the semiconductor chip and the connection terminals formed on the mounting substrate to correspond to the electrode terminals, respectively, by heating the solder resin paste to self-assemble the solder powders in the solder resin paste,
wherein in the step (e), a surplus of the solder powders is accumulated on the electrode pattern.

10. A method for producing a package, comprising:
a step (a) of preparing a semiconductor chip having a chip surface on which electrode terminals are arranged;
a step (b) of preparing a mounting substrate having connection terminals arranged to correspond to the electrode terminals of the semiconductor chip, respectively;
a step (c) of applying, onto the mounting substrate, a solder resin paste with solder powders contained in resin;
a step (d) of disposing the semiconductor chip above the mounting substrate with the solder resin paste interposed therebetween; and
a step (e) of collectively and electrically connecting the electrode terminals of the semiconductor chip and the connection terminals formed on the mounting substrate to correspond to the electrode terminals, respectively, by heating the solder resin paste to self-assemble the solder powders in the solder resin paste, wherein the chip surface of the semiconductor chip prepared in the step (a) is formed with an electrode pattern not electrically connected to the connection terminals, and in the step (e), a surplus of the solder powders is accumulated on the electrode pattern.

11. The method of claim 9 or 10, wherein the solder resin paste further contains, in the resin, a convection-inducing additive which boils when the resin is heated, and by heating the solder resin paste in the step (e), the convection-inducing additive is boiled to generate convection in the resin, thereby self-assembling the solder powders in the solder resin paste.

12. The method of any one of claims 9 to 11, wherein the semiconductor chip prepared in the step (a) is a peripheral-type chip in which the electrode terminals are arranged on an edge region of the chip surface.

13. The method of any one of claims 9 to 11, wherein the solder powders contained in the solder resin paste have a greater amount than solder which forms solder bumps serving as connecting members for collectively and electrically connecting the electrode terminals and the connection terminals.

* * * * *